United States Patent [19]

Miller

[11] Patent Number: 4,959,557

[45] Date of Patent: Sep. 25, 1990

[54] NEGATIVE FEEDBACK CIRCUIT TO CONTROL THE DUTY CYCLE OF A LOGIC SYSTEM CLOCK

[75] Inventor: Joseph P. Miller, Houston, Tex.

[73] Assignee: Compaq Computer Corporation, Houston, Tex.

[21] Appl. No.: 354,227

[22] Filed: May 18, 1989

[51] Int. Cl.$^5$ .............................................. H03K 5/13
[52] U.S. Cl. .................................... 307/265; 307/269
[58] Field of Search ................................ 307/265, 269

[56] References Cited

U.S. PATENT DOCUMENTS

| | | | |
|---|---|---|---|
| 3,906,247 | 9/1975 | Heffner | 307/265 |
| 4,687,995 | 8/1987 | Takator et al. | 307/265 |
| 4,910,703 | 3/1990 | Ikeda et al. | 307/269 |

Primary Examiner—Stanley D. Miller
Assistant Examiner—T. Cunningham
Attorney, Agent, or Firm—Arnold, White & Durkee

[57] ABSTRACT

A circuit for controlling the duty cycle of a high frequency logic system clock using negative feedback. A high-level buffer used to drive the system clock bus receives the output of a crystal oscillator. The buffer output is sampled by an integrator circuit which produces a voltage level corresponding to the duty cycle of the clock, and this volage level is compared to a reference voltage using an operational amplifier. The op-amp output is applied to the buffer input as negative feedback to alter the bias level at the buffer input in a way as to vary the point in the rising and falling transitions of the crystal oscillator where the threshold of the buffer is crossed. A circuit monitors the clock signal output of a high-level buffer, and determines whether the duty cycle of the crystal oscillator which drives the output buffer should be increased or decreased. A corresponding DC bias to the input of the output buffer causes the crystal oscillator output to reach threshold levels of the output buffer at different times during each clock pulse, thus adjusting the duty cycle of the buffer output. An RC integrator is used to monitor the buffer output, and the output of this integrator is compared with a reference voltage in an operational amplifier. The output of the operational amplifier biases the input to the output buffer to a level corresponding to a need to increase or decrease the duty cycle of the buffer output clock signal.

10 Claims, 4 Drawing Sheets

NEGATIVE FEEDBACK CIRCUIT TO CONTROL THE DUTY CYCLE OF A LOGIC SYSTEM CLOCK

BACKGROUND OF THE INVENTION

This invention relates to digital logic systems, and particularly to a circuit for regulating the duty cycle of a clock produced by a crystal oscillator.

In the field of digital logic systems, improved design and manufacturing techniques have afforded a substantial increase in the operating speed of clocked integrated circuit devices, such as microprocessors and semiconductor memory chips. For example, state-of-the-art microprocessors have operating speeds which may approach or exceed 50-Mhz; such devices must be "driven" by a clock circuit having a cycle of 20-nSec or less. Furthermore, such devices often have strict requirements as to the type of waveform produced by these oscillators.

One measure of the quality of an oscillator waveform is the ratio of time the clock is at a substantially "high" logical level (on) to the time the clock is at a substantially "low" logical level (off). This ratio is referred to as the "duty cycle" of the clock, and can be quantified as the percentage of time the clock is on over one period of oscillation. Thus, for example, an ideal square wave has a 50% duty cycle, wherein the clock is on for exactly one-half the period of oscillation, and off for the other half.

Since a very high speed crystal oscillator will typically not produce an ideal, square-wave output, clocked semiconductor devices may require that the duty cycle fall at least within a specified tolerance. For example, a semiconductor device manufacturer may specify that the clock for a microprocessor have a guaranteed duty cycle of better than 40% to 60%, thus ensuring that the clock will neither be on nor off for more than 60% of one period or less than 40% of one period.

As the operating speed of logic devices has increased, the requirements for the duty cycle of clock circuits to drive them has correspondingly increased. Manufacturers of devices such as the 80386, 80387 and 82385 microprocessor parts made by Intel are specifying duty cycles of 45% to 55%; other devices such as a Weitek numeric coprocessor specify 47% to 53%. For a device capable of operating at 50-Mhz, however, a 45% to 55% duty cycle requirement imposes a constraint upon the propagation time; the clock must have high-to-low and low-to-high propagation times (the times required for the oscillator to make high-to-low level or low-to-high level transitions, respectively) less than about 1 nSec (5% of 20-nSec). Moreover, for a 47% to 53% duty cycle specification, the high-to-low and low-to-high propagations of a 50-Mhz clock should be consistently matched to less than 0.6 nSec (3% of 20-nSec). Such strict requirements are met by few, if any, currently available off-the-shelf TTL or CMOS clock devices.

A desktop computer uses a commercially-available crystal oscillator, purchased from manufacturers of such devices, to supply a low-level clock signal of the proper frequency, but this low-level signal must be distributed throughout the board and chassis, and so must be buffered to provide adequate drive. The TTL or CMOS clock buffer circuits needed for this function are not readily constructed using currently available integrated circuit devices.

It is therefore a principle object of this invention to provide an improved high-performance clock voltage source for a computer or the like. Another object is to provide a clock source using commercially-available devices but yet providing tighter tolerances than otherwise permitted using these devices. A further object of the present invention is to provide an apparatus for adapting currently available clock drivers to bring them into conformance with the increasingly rigid standards of operation required in higher-frequency clocked devices.

SUMMARY OF THE INVENTION

In accordance with one embodiment of the present invention, a feedback circuit is used to dynamically regulate the duty cycle of a signal provided by a lower-precision clock generator in order to make such a generator suitable for use in conjunction with very high speed devices having lower tolerances to variation in duty cycle.

The circuit of this example embodiment regulates the duty cycle of a buffered AC signal by monitoring the signal and providing DC feedback to the input of the buffer. The level of DC feedback affects the point at which the AC signal crosses the threshold of the buffer, thereby affecting the duty cycle of the resulting buffer output.

BRIEF DESCRIPTION OF THE DRAWINGS

The novel features believed characteristic of the oscillator regulator circuit of the present invention are set forth in the appended claims. The invention itself, however, as well as additional features and advantages thereof, will be best understood by reference to a detailed description of a specific embodiment which follows, when read in conjunction with the accompanying drawings, wherein:

DETAILED DESCRIPTION OF A SPECIFIC EMBODIMENT

Figure 1:
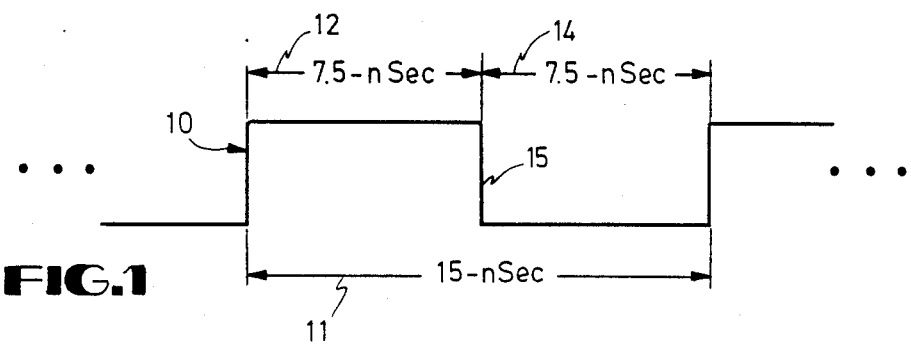
FIGS. 1 through 5 are timing diagrams showing voltage vs. time illustrating the waveforms of several logic clock generators.

Referring to FIGS. 1 through 5, a number of different clock waveforms are illustrated. In FIG. 1, an idealized square-wave clock voltage waveform 10 is shown, the waveform having an exact 50% duty cycle; that is, the clock waveform of FIG. 1 is at a high, or logical "one" level for exactly one-half of its oscillation period, and is at a low, or logical "zero" level for exactly one-half of its oscillation period. In particular, in FIG. 1, the clock waveform has a period 11 of 15-nSec. The high-level (5-volt) portion 12 of the waveform 10 of FIG. 1 lasts for 7.5-nSec per cycle, while the low-level (0-volt) portion also has a duration 14 of 7.5-nSec. Notice that in the "idealized" waveforms of FIGS. 1 through 5, the transition time 15 for the clock signal, either from a low level to a high level or from a high level to a low level, is negligible. In practice, however, especially with the very high frequencies to which the present invention is directed, this is almost never the case. The importance of these transition times will be hereinafter illustrated.

Figure 2:
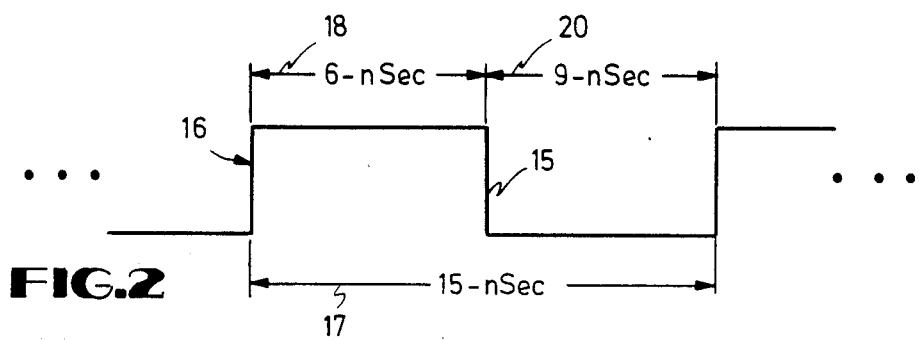
Figure 3:
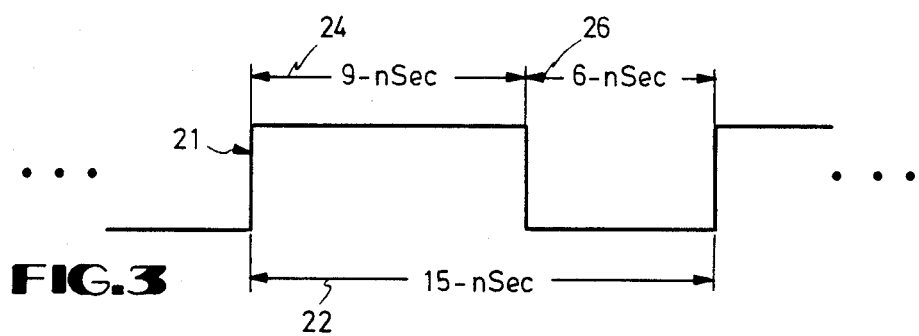
Figure 4:
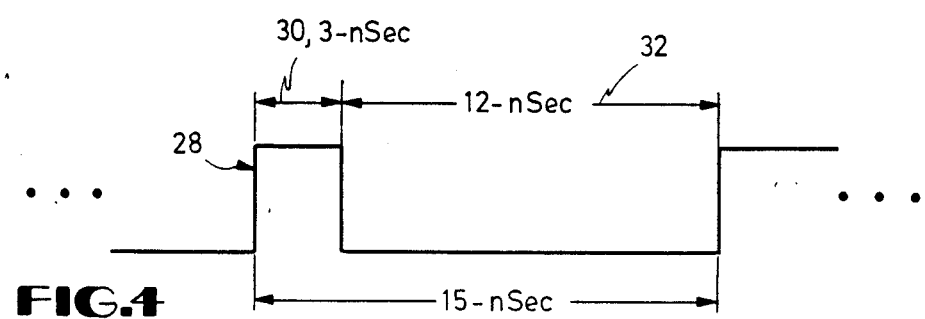

In FIG. 2, another idealized square-wave clock signal 16 is shown having a 40% duty cycle. As in FIG. 1, the period 17 of oscillation of this clock signal is 15-nSec. In the case of FIG. 2, however, the clock 16 has a high level period 18 of only 6-nSec per cycle, and a low level period 20 of 9-nSec per cycle. Similarly, the clock waveform 21 of FIG. 3 has a 15-nSec period 22, during which the waveform 21 is at a high level for a 9n-Sec period 24 and at a low level for a 6-nSec period 26. The waveforms of FIGS. 1, 2 and 3 are each said to be 66.66-Mhz waveforms having 40% to 60% duty cycles, meaning that the high level portions of their 15-nSec oscillation periods (12, 18, and 24, respectively, of FIGS. 1, 2, and 3) last for no less than 40% of the total oscillation period and no more than 60% of the total oscillation period. Semiconductor devices which specify a 66.66-Mhz clock with 40% to 60% duty cycles would operate satisfactorily with each of the waveforms in FIGS. 1, 2, or 3. On the other hand, in FIG. 4, a 66.66-Mhz clock waveform 28 is shown having a 20% duty cycle, wherein the high-level portion 30 of the waveform 28 lasts for only 3-nSec and the low-level portion 32 of the waveform lasts for 12-nSec per cycle. The clock waveform 28 of FIG. 4 would be unacceptable for a device requiring a 66.66-Mhz waveform with a 40% to 60% duty cycle.

Figure 5:
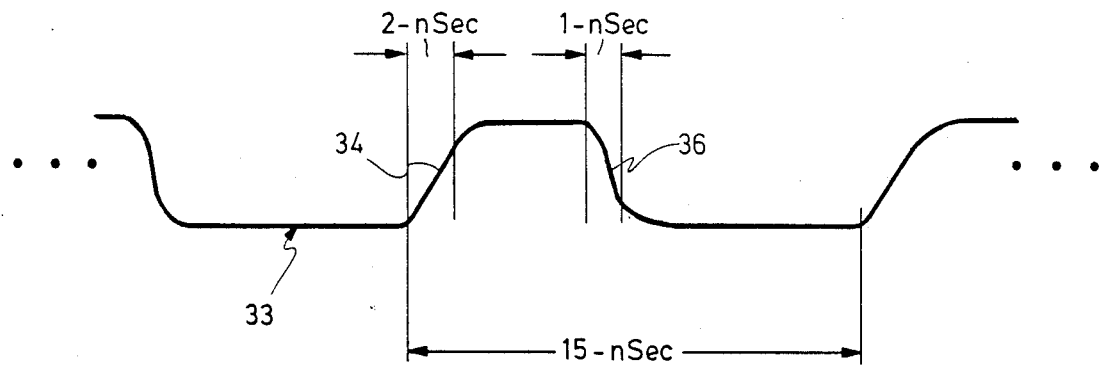

In FIG. 5, a 66.66-Mhz clock voltage waveform 33 is shown which more accurately depicts the signal produced by a real (i.e. non-idealized) clock source. Notice that in FIG. 5, the waveform 33 does not have the sharp, well defined low-to-high and high-to-low transitions of the idealized waveforms of FIGS. 1 through 4. In FIG. 5, the clock waveform takes approximately 2-nSec to make the low-to-high transition 34, and takes approximately 1-nSec to make the high-to-low transition 36. Thus, in the non-idealized waveform 33 of FIG. 5, the waveform spends approximately 3-nSec during each 15n-Sec oscillation period in transition between high and low levels. It should be noted that for slower clock speeds, such as 20-Mhz or less, the transitions 34 and 36 in FIG. 5 would be more acceptable.

In practice, duty cycles for electronic devices are normally specified at a particular voltage. For transistor-transistor logic (TTL) devices, for example, the duty cycle is typically specified for a voltage from 1.4-volts to 1.8-volts; for complementary metal-oxide semiconductor (CMOS) devices, duty cycles are usually specified for a voltage from 2.0-volts to 2.5-volts.

Figure 6:
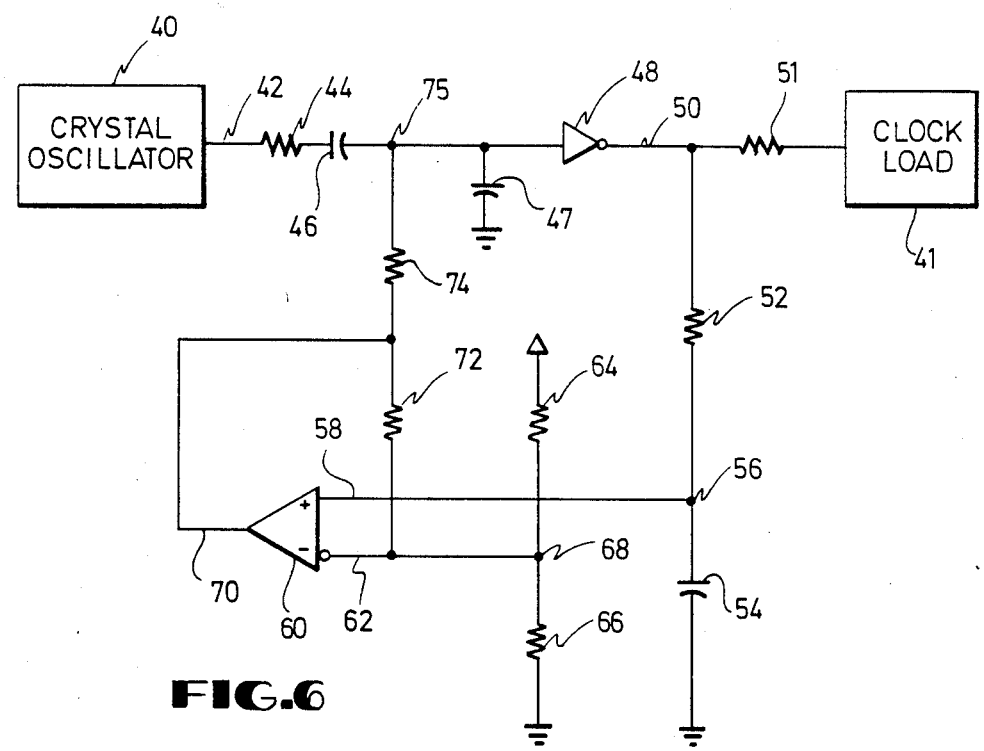
FIG. 6 is an electrical schematic circuit diagram of one embodiment of the duty cycle regulating circuit of the present invention.

Referring now to FIG. 6, a clock buffer circuit having duty cycle control in accordance with the present invention is shown. A commercially-available crystal oscillator 40, of the type manufactured by a number of companies, is shown having a single output 42 which carries a 66.66-Mhz clock signal. This signal on line 42 is of the proper frequency, and may have the proper duty cycle, but does not have sufficient drive to serve as a clock for the entire computer system. Accordingly, the signal on line 42 is applied through resistor 44 and capacitor 46 to a large, high-level inverter/buffer 48 to drive the clock loads, designated generally as 41 in FIG. 6. As would be apparent to one of ordinary skill in the circuit design art, the combination of resistor 44 and capacitor 46 constitutes a high-pass filter which prevents low-frequency and DC components of the oscillating output of crystal oscillator 40 from being applied to the input of buffer 48. In this way, any DC component of a signal applied to the input of buffer 48 is provided at node 75, as shall be hereinafter described.

The output signal from the high-level buffer 48 on line 50 is applied to the bus 41 via resistor 51, and is also applied to an RC integrator circuit comprising resistor 52 and capacitor 54. The output signal of buffer 48 is integrated as each positive-going pulse of the clock signal output 50 of buffer 48 charges the capacitor 54 through resistor 52. Consequently, the amount of charge stored on capacitor 54 is proportional to the amount of time that output signal 50 spends at the high level output voltage of buffer 48. In the present embodiment of the invention, resistor 52 has a value of 10-KSL and capacitor 54 has a value on the order of 1-nF or so. However, as will be apparent to those of ordinary skill in the art of circuit design, and advantage of the circuit of FIG. 6 is its independence over a wide range of values for resistor 52 and capacitor 54.

As the duty cycle (high-level portion) of oscillating output 50 increases in duration, the average amount of charge on capacitor 54 correspondingly increases. Thus, the DC voltage at node 56 is a representation of the duty cycle of the clock waveform at node 50. For a 50% duty cycle, the voltage at node 56 is 2.5-volts (i.e., one-half the 5-volt high-level output of oscillator 40 and buffer 48), for the nominal clock frequency being used.

The voltage at node 56 is provided to the non-inverting input 58 of operational amplifier (op-amp) 60. A reference voltage is established at the inverting input 62 of op-amp 60 by means of resistors 64 and 66. Resistors 64 and 66 comprise a simple voltage divider circuit between a +5-volt supply and ground. The values of resistors 64 and 66 are the same, so that in the absence of other influences, node 68 between resistors 64 and 66 would remain generally near 2.5-volts.

Operational amplifier 60 may be any of a variety of types commercially available. Output 70 of op-amp 60 is used in two ways: First, output 70 is passed through resistor 72 to the inverting input 62 of the op-amp 60 in order to establish a feedback-loop which regulates the amplification provided by op-amp 60. The values of resistors 64, 66, and 72 being such that the gain of the op-amp is about five; a higher gain produces oscillation which phase-modulates the clock voltage, while a lower gain is inadequate for control. Second, output 70 passes through resistor 74 and is coupled to the input 75 of buffer 48 to "bias" this input as hereinafter described.

The circuit of FIG. 6 regulates the duty cycle of the clock voltage at the output 50 of the buffer in the following manner: The difference between the voltage at node 56 (reflecting the duty cycle of the clock signal output 50 of buffer 48) and the reference voltage at node 68 is amplified by op-amp 60. The output 70 of op-amp 60 functions to bias the output from oscillator 40 as it is coupled through capacitor 46 to input node 75. That is, the DC level of oscillator output 42 as it appears at node 75 is raised or lowered in order to vary the amount of time at which output 42 spends above and below the input threshold of buffer 48. This process will be hereinafter described in greater detail, with reference to FIGS. 7 through 9.

Figure 7:
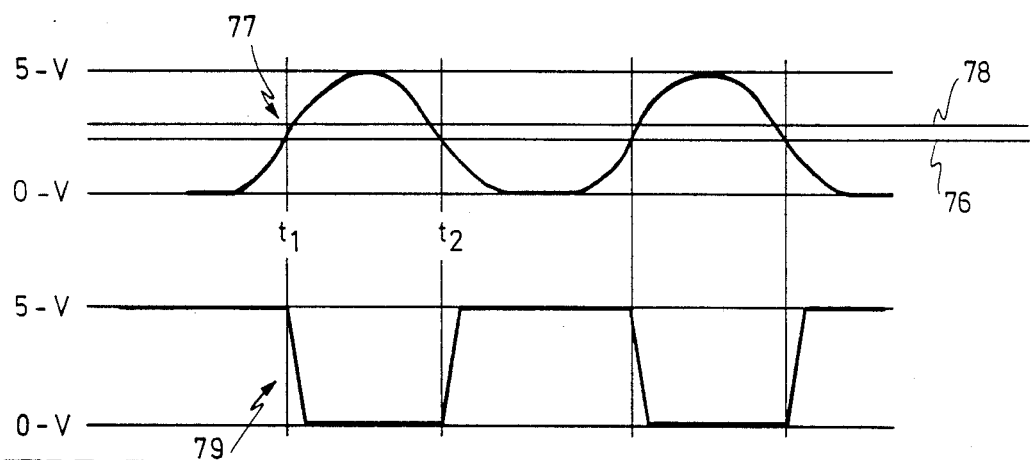
FIGS. 7 through 9 are timing diagrams showing voltage vs. time for the output waveform of the crystal oscillator of FIG. 6 and the output waveforms of the buffer of FIG. 6.

FIG. 7 is a diagram of the clock voltage input waveform 77 at the input 75 of the buffer 48. Dashed lines 76 and 78 in FIG. 7 represent (in exaggerated form) the input voltage threshold margins for buffer 48. Any input voltage to buffer 48 at node 75 between ground (0-volts) and the voltage level indicated by dashed line 76 is considered a logical "zero"; similarly, any input voltage to buffer 48 less than 5-volts but greater than the level indicated by dashed line 78 is considered a logical "one". Voltages which fall between dashed lines 76 and 78 are inputs for which the output of buffer 48 is not specified by the manufacturer, lying somewhere between 0-volts and 5-volts. The threshold lines 76 and 78 may indeed be coincident or virtually coincident, i.e., the operation of the negative feedback control is not dependent upon separation of lines 76 and 78 as illustrated.

Buffer 48 is an inverting buffer, so that a low-level (logical "zero" input) causes a high-level (logical "one") output, and vice-versa. Thus, for the waveform of FIG. 7, the positive-going clock signal will cause buffer output on line 50 as seen by waveform 79 to fall to a "zero" output at time t1, when the input clock signal crosses the threshold region from low to high indicated by dashed line 78. Then, at time t2, buffer output 50 makes a transition to a high level, when the input clock signal crosses the threshold region from high to low indicated by dashed line 76.

Figure 8:
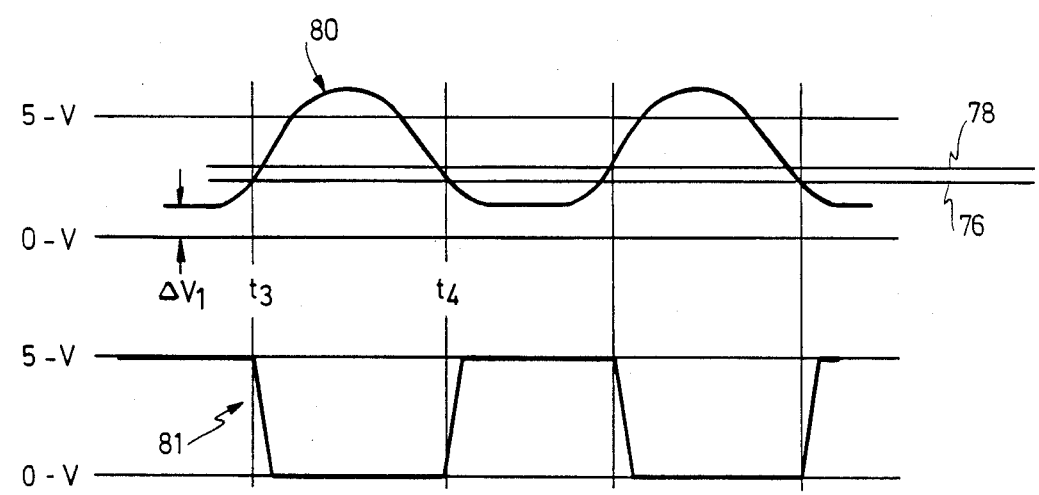

FIG. 8 illustrates an output voltage waveform like FIG. 7, shifted upward by an amount V1 as accomplished by the negative feedback loop. Note that in FIG. 8, the upward shift of the waveform causes it to intersect the threshold levels 76, 78 of buffer 48 at times t3 and t4, respectively, which are spaced farther apart than t1 and t2, resulting in an output voltage waveform 81 at node 50.

Figure 9:
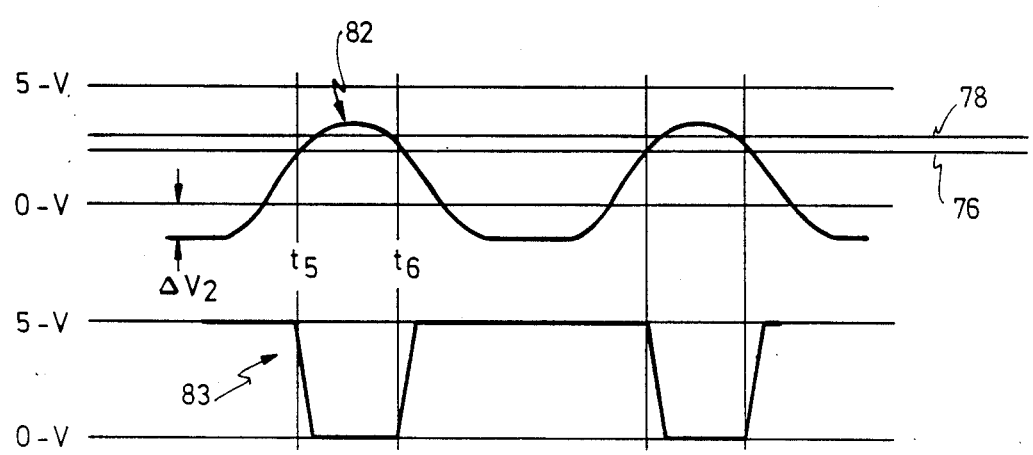

Similarly, in FIG. 9, the waveform of FIG. 7 is shown having been shifted downward by an amount V2 to produce a waveform 82 at the input of buffer 48. In the case of FIG. 9, the waveform intersects the threshold levels 76, 78 of buffer 48 at times t6 and t5, respectively, which are spaced closer together than t1 and t2, producing an output voltage 83 on node 50.

The upward and downward shifts of the clock output waveform depicted in FIGS. 8 and 9 can be realized, in practice, by "biasing" the clock signal at the input node 75 to buffer 48; that is, by increasing the DC component of the voltage at the input node 75 to buffer 48 (as shown in FIG. 8), the clock signal output 42 can pass through the buffer threshold value 78 sooner on the rising edge of each cycle, and pass through the threshold region 76 later on the falling edge of each clock cycle. Conversely, by lowering the DC component of the voltage at the input to buffer 48 (as shown in FIG. 9), the clock signal output 42 will pass through the threshold region 78 later on the rising edge of each clock cycle, and will pass through the threshold region 76 earlier on the falling edge of each clock cycle. Thus, by varying the DC voltage at the input to buffer 48, the duty cycle of the resultant clock voltage output signals 79, 81 or 83 at the output 50 of buffer 48 can be correspondingly varied.

In the circuit of FIG. 6, the output 70 of op-amp 60 is coupled to the input of buffer 48 via resistor 74. Charge flowing through resistor 74 is transferred to or from the input capacitance 47 of the buffer, thus increasing or decreasing the DC voltage across that capacitor. In this way, depending upon the output of op-amp 60, the DC component of the voltage at the input of buffer 48 can be modified, effectively biasing the output 42 of oscillator 40 This has the effect of correspondingly modifying the duty cycle of the output 50 of buffer 48, as described above in conjunction with FIGS. 7 through 9.

In summary, a negative feedback circuit has been shown which dynamically monitors the output at node 50 of high-level inverter/buffer 48, and regulates the DC bias at the input to buffer 48 so that a standard crystal oscillator 40 may be used to produce an accurate output to clock loads 41. In the embodiment disclosed herein, the output of the high-level buffer is integrated by means of resistor 52 and capacitor 54 in order to obtain a representation of the duty cycle of the clock signal emitted from buffer 48. This representation of the actual duty cycle is compared, by means of op-amp 60, with a preset reference voltage established between resistors 64 and 66. According to the outcome of this comparison, the op-amp delivers more or less charge to the input capacitor 47 of buffer 48. According to how much charge is delivered to this node 75, the output 42 of crystal oscillator 40 is more or less biased with respect to the threshold voltages of buffer 48, thus varying the duty cycle of the output 50 of buffer 48.

It should be noted, with reference to FIGS. 7 through 9, that shifting the oscillator output up or down before applying it to the input of buffer 48 is only effective in altering the duty cycle of the buffer output 50 in the case that the input to buffer 48 is not a perfect square wave having ideal, zero-time high-to-low and low-to-high transitions. Rather, the times at which the oscillator output reach the threshold levels of buffer 48 are most optimally and gradually adjusted by a DC shift in the buffer input when the oscillator output 42 is substantially sinusoidal or triangular, as suggested by the waveforms 77, 80 and 82 in FIGS. 7 through 9. Since the frequency spectrum of waveforms having sharp, idealized transitions have large high-frequency components, the low-pass filter comprising resistor 44 and input capacitance 47 effectively functions to reduce the high-frequency components of the oscillator output 42, causing the waveform applied to the input of buffer 48 to have the substantially sinusoidal form shown in FIGS. 7 through 9.

Figure 10:
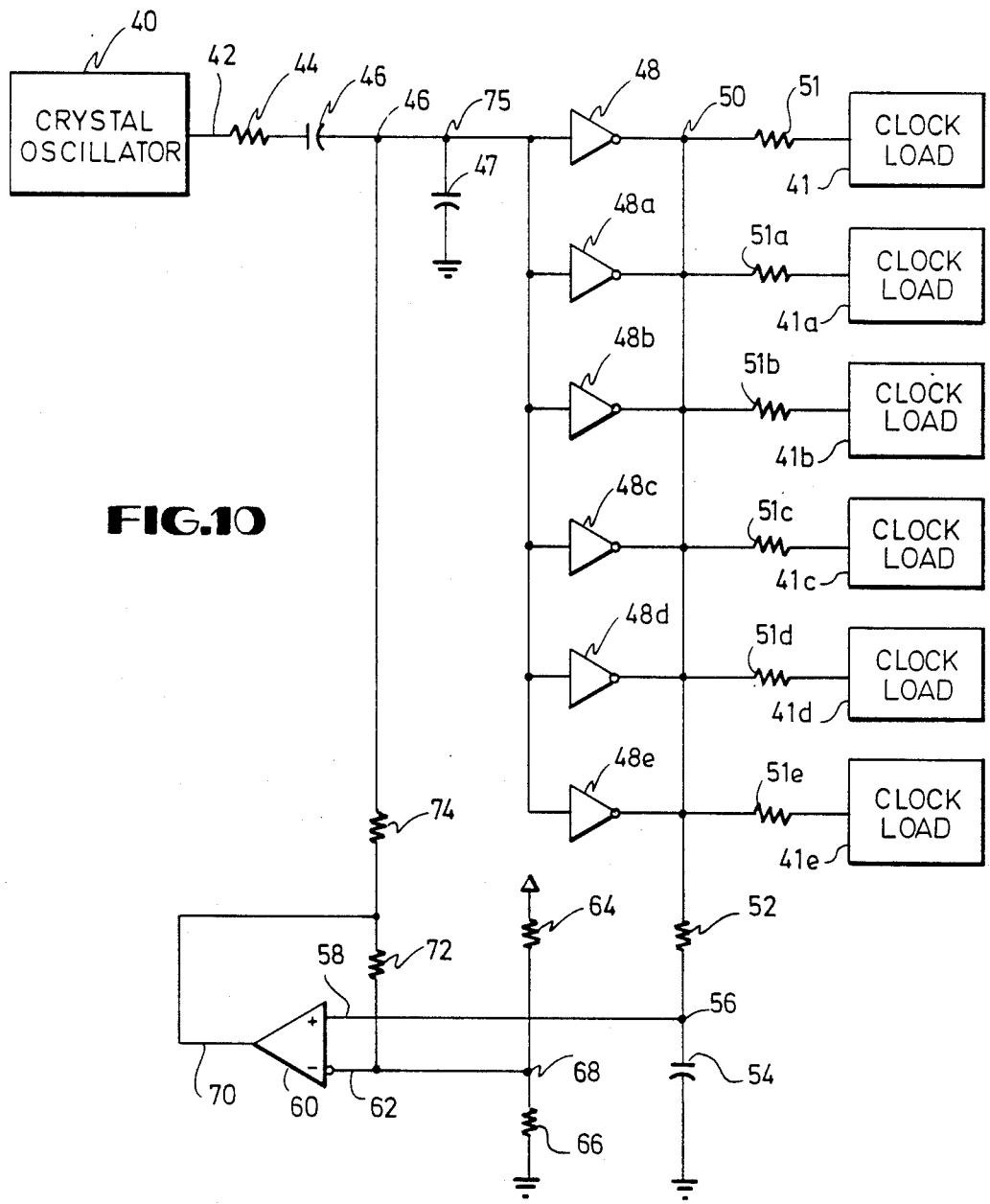
FIG. 10 is an electrical schematic circuit diagram of another embodiment of the duty cycle regulating circuit of the present invention.

Turning now to FIG. 10, another embodiment of the present invention is shown. The circuit of FIG. 10 is identical to that of FIG. 6, except that multiple additional buffers 48a through 48e are coupled to node 75. The outputs of buffers 48 and 48a–48e are commonly coupled at node 50 to resistor 52, and each of the buffers 48a–48e is also coupled, via resistors 51a–51e respectively, to respective clock loads 41a–41e. Thus, from FIG. 4, it can be seen that the circuit of the present invention can be utilized to drive multiple clock loads, with identical duty cycle compensation for all clock loads.

The values of various resistors and capacitors in the disclosed embodiment may be modified according to the requisite tolerance required from the clock signal in a given particular application. For example, the duty cycle of the buffer output signal can be varied from the 50% duty cycle disclosed herein by adjusting the ratio of component values of resistors 64 and 66.

Furthermore, while the disclosed embodiment was applied to the regulation of the duty cycle of a 66.66-Mhz oscillator, it should be apparent that the method and apparatus of the present invention may be effectively applied in the regulation of other clocks, having either a higher or lower frequency. Finally, although several specific components of the circuit of the present invention, such as the buffer 48, oscillator 40, or op-amp 60 were identified in the foregoing detailed description, this was done strictly for the purposes of illustration, and it should be noted that any substantially equivalent components could be substituted therefor.

Although a specific embodiment of the present invention has been described herein in detail, it is to be understood that various changes, substitutions and alterations may be made therein without departing from the spirit and scope of the present invention as defined in the appended claims.

What is claimed is:

1. A device for dynamically regulating the duty cycle of an oscillating signal, comprising:
    a high-level buffer having an input for receiving said oscillating signal and generating a buffered signal at an output;
    a circuit receiving said buffered signal and generating a voltage signal corresponding to the duty cycle of said buffered signal;
    a comparator receiving said voltage signal and a reference signal and producing a biasing signal for applying to said buffer input as negative feedback.

2. A device according to claim 1 wherein said oscillating signal is coupled to said input of said buffer through a high-pass filter.

3. A device according to claim 1 wherein said circuit generating said voltage signal is an integrator.

4. A device according to claim 1, wherein said reference signal is generated by a voltage divider connected across a constant voltage supply and ground potential.

5. A device according to claim 1, wherein said comparator comprises an operational amplifier having an inverting input and a non-inverting input, and wherein said reference signal is coupled to said inverting input and said voltage signal is coupled to said non-inverting input.

6. A method for dynamically regulating the duty cycle of a clock signal, comprising the steps of:
    (a) applying a clock oscillator signal to an input of a buffer to produce a high-level clock signal;
    (b) generating an indicator signal having a voltage level corresponding to the duty cycle of said clock signal;
    (c) generating a feedback biasing signal having a voltage level determined by comparing a reference signal with said indicator signal and applying said feedback biasing signal to said input of said buffer.

7. A method according to claim 6 including the step of shaping said clock oscillator signal to provide a signal having wide rise and fall times.

8. A method according to claim 6 wherein said step of generating an indicator signal comprises integrating said clock signal.

9. A method according to claim 6 including the step of generating said reference signal by a voltage divider connected across a constant voltage supply and ground potential.

10. A method according to claim 6 wherein said step of generating a biasing signal comprises applying said reference signal to one input of an operational amplifier, applying said indicator signal to another input of said operational amplifier, and coupling the output of said operational amplifier to said input of said buffer and to an input of said operational amplifier.

* * * * *